United States Patent
Liang et al.

(10) Patent No.: US 8,605,760 B2
(45) Date of Patent: Dec. 10, 2013

(54) FEEDBACK-ENHANCED SELF-INJECTION LOCKING OF LASERS TO OPTICAL RESONATORS

(75) Inventors: Wei Liang, Monrovia, CA (US); Vladimir S. Ilchenko, Arcadia, CA (US); Andrey B. Matsko, Pasadena, CA (US); Anatoliy A. Savchenkov, Glendale, CA (US); David Seidel, Alta Loma, CA (US); Lute Maleki, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 170 days.

(21) Appl. No.: 13/207,373

(22) Filed: Aug. 10, 2011

(65) Prior Publication Data

US 2012/0039346 A1  Feb. 16, 2012

Related U.S. Application Data

(60) Provisional application No. 61/372,389, filed on Aug. 10, 2010.

(51) Int. Cl.
*H01S 3/098* (2006.01)

(52) U.S. Cl.
USPC ............. 372/18; 372/29.011; 372/32; 372/94

(58) Field of Classification Search
USPC ................... 372/18, 29.011, 32, 94
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |

(Continued)

FOREIGN PATENT DOCUMENTS

| | | |
|---|---|---|
| WO | WO-01/96936 A1 | 12/2001 |
| WO | WO-2005/038513 A2 | 4/2005 |

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Yuanda Zhang

(74) *Attorney, Agent, or Firm* — Perkins Coie LLP

(57) ABSTRACT

Techniques and devices that lock and stabilize a laser to an optical resonator via self-injection locking based on a reflection feedback. A whispering gallery mode optical resonator can be implemented to provide both the optical filtering and injection feedback based on the reflection feedback from feedback optics outside the optical resonator.

28 Claims, 12 Drawing Sheets

(56) References Cited

U.S. PATENT DOCUMENTS

| | | | |
|---|---|---|---|
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,535,328 B2 | 3/2003 | Yao | |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,762,869 B2 | 7/2004 | Maleki et al. | |
| 6,795,481 B2 | 9/2004 | Maleki et al. | |
| 6,798,947 B2 | 9/2004 | Iltchenko | |
| 6,853,479 B1 | 2/2005 | Ilchenko et al. | |
| 6,871,025 B2 | 3/2005 | Maleki et al. | |
| 6,873,631 B2 | 3/2005 | Yao et al. | |
| 6,879,752 B1 | 4/2005 | Ilchenko et al. | |
| 6,901,189 B1 | 5/2005 | Savchenkov et al. | |
| 6,906,309 B2 | 6/2005 | Sayyah et al. | |
| 6,922,497 B1 | 7/2005 | Savchenkov et al. | |
| 6,928,091 B1 | 8/2005 | Maleki et al. | |
| 6,943,934 B1 | 9/2005 | Ilchenko et al. | |
| 6,987,914 B2 | 1/2006 | Savchenkov et al. | |
| 7,024,069 B2 | 4/2006 | Savchenkov et al. | |
| 7,043,117 B2 | 5/2006 | Matsko et al. | |
| 7,050,212 B2 | 5/2006 | Matsko et al. | |
| 7,061,335 B2 | 6/2006 | Maleki et al. | |
| 7,062,131 B2 | 6/2006 | Ilchenko | |
| 7,092,591 B2 | 8/2006 | Savchenkov et al. | |
| 7,133,180 B2 | 11/2006 | Ilchenko et al. | |
| 7,173,749 B2 | 2/2007 | Maleki et al. | |
| 7,184,451 B2 | 2/2007 | Ilchenko et al. | |
| 7,187,870 B2 | 3/2007 | Ilchenko et al. | |
| 7,218,662 B1* | 5/2007 | Ilchenko et al. | 372/67 |
| 7,248,763 B1 | 7/2007 | Kossakovski et al. | |
| 7,260,279 B2 | 8/2007 | Gunn et al. | |
| 7,283,707 B1 | 10/2007 | Maleki et al. | |
| 7,356,214 B2 | 4/2008 | Ilchenko | |
| 7,362,927 B1 | 4/2008 | Ilchenko et al. | |
| 7,369,722 B2* | 5/2008 | Yilmaz et al. | 385/27 |
| 7,389,053 B1 | 6/2008 | Ilchenko et al. | |
| 7,400,796 B1 | 7/2008 | Kossakovski et al. | |
| 7,440,651 B1 | 10/2008 | Savchenkov et al. | |
| 7,460,746 B2 | 12/2008 | Maleki et al. | |
| 7,480,425 B2 | 1/2009 | Gunn et al. | |
| 7,587,144 B2 | 9/2009 | Ilchenko et al. | |
| 7,630,417 B1 | 12/2009 | Maleki et al. | |
| 7,634,201 B2 | 12/2009 | Maleki et al. | |
| 7,680,372 B2* | 3/2010 | Dang et al. | 385/31 |
| 7,801,189 B2 | 9/2010 | Maleki et al. | |
| 7,813,651 B2 | 10/2010 | Ilchenko et al. | |
| 7,869,472 B2 | 1/2011 | Maleki et al. | |
| 7,929,589 B1 | 4/2011 | Ilchenko et al. | |
| 7,965,745 B2 | 6/2011 | Maleki et al. | |
| 7,991,025 B2 | 8/2011 | Maleki et al. | |
| 8,089,684 B1 | 1/2012 | Koonath et al. | |
| 8,094,359 B1 | 1/2012 | Matsko et al. | |
| 8,102,597 B1 | 1/2012 | Maleki et al. | |
| 8,111,722 B1* | 2/2012 | Maleki et al. | 372/18 |
| 8,155,913 B2 | 4/2012 | Eliyahu et al. | |
| 8,155,914 B2 | 4/2012 | Eliyahu et al. | |
| 8,159,736 B2 | 4/2012 | Maleki et al. | |
| 2001/0038651 A1 | 11/2001 | Maleki et al. | |
| 2002/0018611 A1 | 2/2002 | Maleki et al. | |
| 2002/0018617 A1 | 2/2002 | Iltchenko et al. | |
| 2002/0021765 A1 | 2/2002 | Maleki et al. | |
| 2002/0081055 A1 | 6/2002 | Painter et al. | |
| 2002/0085266 A1 | 7/2002 | Yao | |
| 2002/0097401 A1 | 7/2002 | Maleki et al. | |
| 2003/0160148 A1 | 8/2003 | Yao et al. | |
| 2004/0100675 A1 | 5/2004 | Matsko et al. | |
| 2004/0109217 A1 | 6/2004 | Maleki et al. | |
| 2004/0218880 A1 | 11/2004 | Matsko et al. | |
| 2004/0240781 A1 | 12/2004 | Savchenkov et al. | |
| 2005/0017816 A1 | 1/2005 | Ilchenko et al. | |
| 2005/0025199 A1* | 2/2005 | Ma | 372/20 |
| 2005/0063034 A1 | 3/2005 | Maleki et al. | |
| 2005/0074200 A1 | 4/2005 | Savchenkov et al. | |
| 2005/0123306 A1 | 6/2005 | Ilchenko et al. | |
| 2005/0128566 A1 | 6/2005 | Savchenkov et al. | |
| 2005/0175358 A1 | 8/2005 | Ilchenko et al. | |
| 2005/0248823 A1 | 11/2005 | Maleki et al. | |
| 2005/0286602 A1* | 12/2005 | Gunn et al. | 372/94 |
| 2007/0009205 A1 | 1/2007 | Maleki et al. | |
| 2007/0153289 A1 | 7/2007 | Yilmaz et al. | |
| 2008/0001062 A1 | 1/2008 | Gunn et al. | |
| 2008/0075464 A1 | 3/2008 | Maleki et al. | |
| 2008/0310463 A1* | 12/2008 | Maleki et al. | 372/20 |
| 2009/0097516 A1 | 4/2009 | Maleki et al. | |
| 2009/0135860 A1 | 5/2009 | Maleki et al. | |
| 2009/0208205 A1 | 8/2009 | Eliyahu et al. | |
| 2009/0251705 A1 | 10/2009 | Le et al. | |
| 2009/0310629 A1 | 12/2009 | Maleki et al. | |
| 2009/0324251 A1 | 12/2009 | Ilchenko et al. | |
| 2011/0110387 A1 | 5/2011 | Maleki et al. | |
| 2011/0150485 A1 | 6/2011 | Seidel et al. | |
| 2011/0255094 A1 | 10/2011 | Mohageg et al. | |
| 2012/0039346 A1 | 2/2012 | Liang et al. | |

FOREIGN PATENT DOCUMENTS

| | | |
|---|---|---|
| WO | WO-2005/055412 A2 | 6/2005 |
| WO | WO-2005/067690 A2 | 7/2005 |
| WO | WO-2005/122346 A2 | 12/2005 |
| WO | WO-2006/076585 A2 | 7/2006 |
| WO | WO-2007/143627 A2 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-Q Whispering-Gallery Modes," *J.Opt. Soc. Am. B*, 16(1):147-154, Jan. 1999.

Gorodetsky, M.L., et al., "Rayleigh Scattering in High-Q Microspheres," *J. Opt. Soc. Am. B*, 17(6):1051-1057, Jun. 2000.

Gorodetsky, M.L., et al., "Ultimate Q of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-Q Microsphere Cavity: A Simple Fiber Coupler for Optical Whispering-Gallery Modes," *Optics Letters*, 24(11):723-725, Jun. 1999.

Ilchenko, V., et al., "Sub-Micro Watt Photonic Microwave Receiver," *IEEE Photonics Technology Letters*, 14(11):1602-1604, Nov. 2002.

(56) References Cited

OTHER PUBLICATIONS

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "RF photonic signal processing components: From high order tunable filters to high stability tunable oscillators," *IEEE Radar Conference*, pp. 1-6, May 2009.

Savchenkov, A., et al., "Tunable Resonant Single-Sideband Electro-Optical Modulator," *Digest of the IEEE/LEOS Summer Topical Meetings*, pp. 63-64, Jul. 2009.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-Q Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Technology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(I):79-84, Jan. 2000.

Yao, X.S., et al., "Optoelectronic Microwave Oscillator," *J. Opt. Soc. Am. B*, I3(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

Savchenkov, A., et al., "Voltage Controlled Photonic Oscillator," *Opt. Lett.*, 35:1572-1574, 2010.

Savchenkov, A., et al., "Whispering-Gallery Mode Based Opto-Electronic Oscillators," *Proceedings of IEEE IFCS*, 2010.

Ilchenko, V., et al., "Ka-Band All-Resonant Photonic Microwave Receiver," *IEEE Photonics Technology Letters*, 20:1-4, 2008.

Ilchenko, V., et al., "Coherent Resonant Ka-Band Photonic Microwave Receiver," arXiv.org, http://arxiv.org/pdf/0806.3239v1, Jun. 19, 2008.

Maleki, L., et al., "High Performance, Miniature Hyper-Parametric Microwave Photonic Oscillator," *Proceedings of IEEE IFCS*, 2010.

Dahmani, B., et al., "Frequency Stabilization of Semiconductor Lasers by Resonant Optical Feedback," *Opt. Lett.*, 12(11):876-878, Nov. 1987.

Hollberg, L., et al., "Modulatable Narrow-Linewidth Semiconductor Lasers," *Appl. Phys. Lett.*, 53(11):944-946, Sep. 12, 1988.

Hemmerich, A., et al., "Compact Source of Coherent Blue Light," *Appl. Opt.*, 33(6):988-991, Feb. 20, 1994.

Vassiliev, V., et al., "Diode Laser Coupled to a High-Q Microcavity via a GRIN Lens", *Appl. Phys. B*, 76:521-523, Apr. 24, 2003.

Kieu, K., et al., "Fiber Laser Using a Microsphere Resonator as a Feedback Element," *Opt. Lett.*, 32(3):244-246, Feb. 1, 2007.

Liang, W., et al., "Ultra-Narrow Linewidth External Cavity Semiconductor Lasers Using Crystalline Whispering Gallery Mode Resonators," arXiv.org, http://arxiv.org/pdf/1008.0896, Aug. 5, 2010.

* cited by examiner

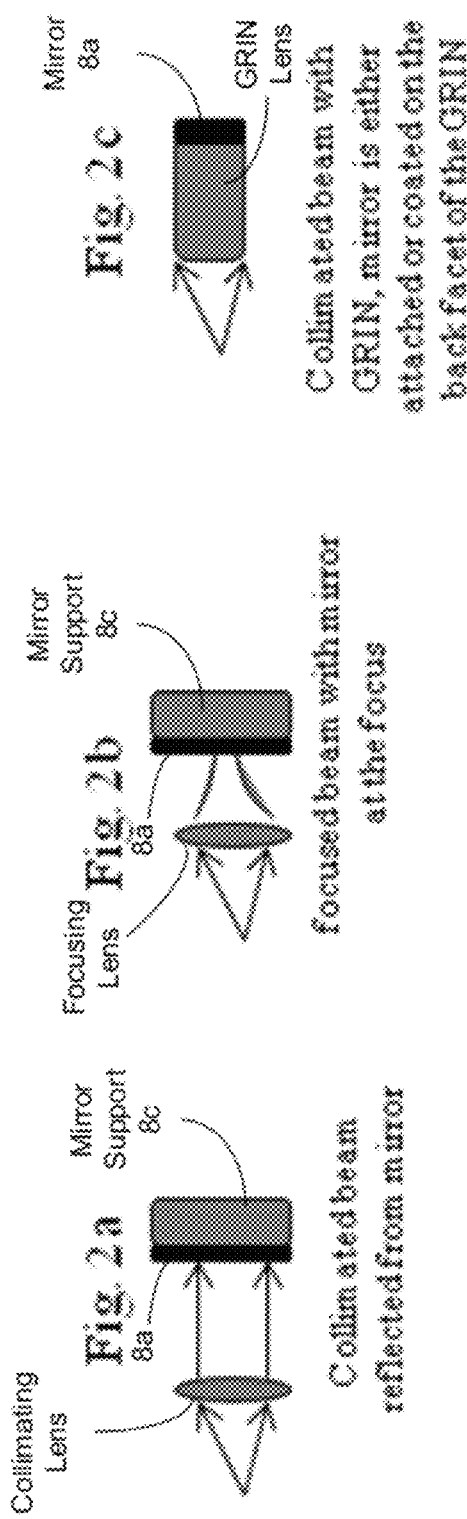

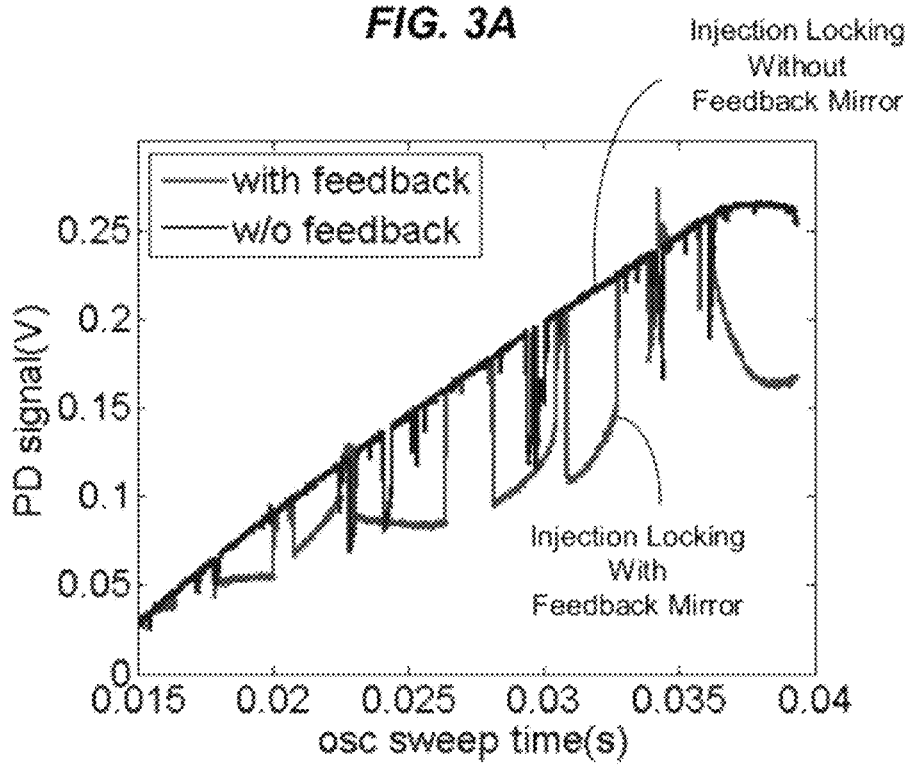
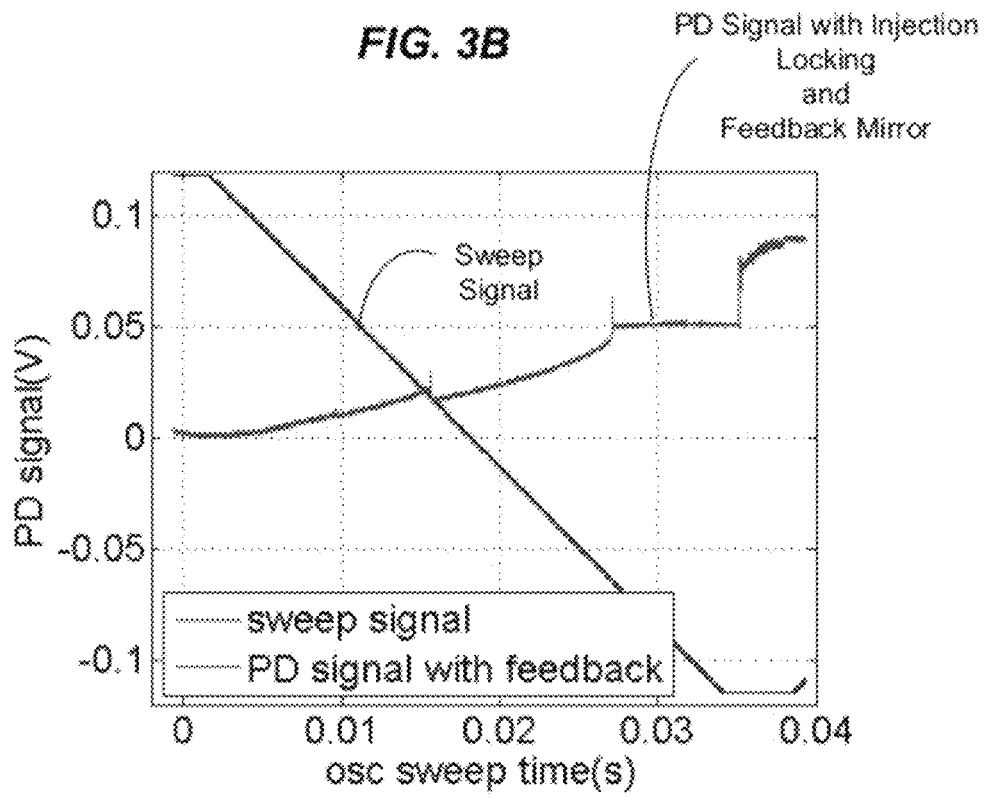

FEEDBACK-ENHANCED SELF-INJECTION LOCKING OF LASERS TO OPTICAL RESONATORS

PRIORITY CLAIM AND RELATED APPLICATION

This patent document claims the benefit of U.S. Provisional Application No. 61/372,389 entitled "A novel feedback configuration to improve self-injection locking of a laser to a dielectric resonator" and filed Aug. 10, 2010, the disclosure of which is incorporated by reference as part of the specification of this patent document.

BACKGROUND

The subject matter of this patent document relates to lasers and laser stabilization.

A laser can be subject to various perturbations and changes and the laser operations can be adversely affected by such perturbations and changes. For example, temperature fluctuations and vibrations can cause the laser to fluctuate in the laser wavelength, and the laser power level and the optical phase of the laser. Various laser stabilization techniques can be used to stabilize a laser against perturbations and changes and to reduce the laser linewidth.

SUMMARY

This patent document discloses, among others, examples and implementations of techniques and devices that lock and stabilize a laser to an optical resonator via self-injection locking based on a reflection feedback. A whispering gallery mode optical resonator can be implemented to provide both the optical filtering and injection feedback based on the reflection feedback from feedback optics outside the optical resonator.

In one aspect, a laser device can be configured to include a laser that produces a laser beam at a laser frequency; an optical resonator structured to support whispering gallery modes circulating in the optical resonator, the optical resonator being optically coupled to the laser to receive a portion of the laser beam into the optical resonator in one or more whispering gallery modes to circulate in the optical resonator; a first optical coupler located in an optical path of the laser beam to couple at least a portion of the laser beam into the optical resonator to circulate in the optical resonator along a first direction and to couple light, that circulates in the optical resonator along a second direction opposite to the first direction, out of the optical resonator as feedback light to the laser to stabilize the laser frequency and to reduce a linewidth of the laser; and a second optical coupler coupled to the optical resonator at a location different from a location of the first optical coupler with respect to the optical resonator, the second optical coupler to couple light in the optical resonator that circulates along the first direction out of the optical resonator as an output light beam. This laser device includes a feedback optics device located in an optical path of the output light beam output by the second optical coupler to receive the output light beam and to reflect at least a portion of the output light beam back into the second optical coupler as a reflected light beam. The second optical coupler couples at least a portion of the reflected light beam into the optical resonator along the second direction to increase optical energy of light in the optical resonator that circulates along the second direction to enhance optical energy that is fed back to the laser by the first optical coupler to effectuate injection locking of the laser to the optical resonator.

In another aspect, a method for locking a laser can be implemented to include operating a laser to produce a laser beam at a laser frequency; operating a first optical coupler to (1) couple a portion of the laser beam into an optical resonator, that is structured to support whispering gallery modes, to circulate along a first direction inside the optical resonator, and (2) couple light, that circulates in the optical resonator along a second direction opposite to the first direction, out of the optical resonator as feedback light to the laser to stabilize the laser frequency and to reduce a linewidth of the laser; operating a second optical coupler, at a location different from a location of the first optical coupler with respect to the optical resonator, to couple light in the optical resonator that circulates along the first direction out of the optical resonator as an output light beam; and operating a feedback optics device located in an optical path of the output light beam output by the second optical coupler to receive the output light beam and to reflect at least a portion of the output light beam back into the second optical coupler as a reflected light beam, and to couple at least a portion of the reflected light beam into the optical resonator along the second direction to increase optical energy of light in the optical resonator that circulates along the second direction to enhance optical energy that is fed back to the laser by the first optical coupler to effectuate injection locking of the laser to the optical resonator. In one implementation of this method, a small portion of the laser beam of the laser can be coupled into the optical resonator to reduce optical nonlinearity or thermal instability caused by the laser beam inside the optical resonator. In another implementation of the this method, a semiconductor laser can be used as the laser to apply a current to the semiconductor laser to produce the laser beam and the reflectivity of the feedback optics device, the first and second optical couplers can be configured to increase a range of the current in which the semiconductor laser is locked in frequency to the optical resonator via injection locking beyond a range of the current for maintaining the injection locking in absence of the feedback optics device.

In yet another aspect, a laser device can be implemented to include a first optical reflector that reflects light; a semiconductor optical amplifier (SOA) located on one side of the first optical reflector and configured to produce an optical gain and amplify light; an optical resonator structured to support optical modes circulating in the optical resonator in two opposite directions, the optical resonator being optically coupled to the SOA to receive light from the SOA; a first optical coupler located to couple light from the SOA into the optical resonator to circulate in the optical resonator along a first direction and to couple light in the optical resonator, that circulates along a second direction opposite to the first direction, out of the optical resonator as feedback light to the SOA, wherein the SOA is located between the first optical reflector and the first optical coupler. This laser device includes a second optical coupler coupled to the optical resonator at a location different from a location of the first optical coupler with respect to the optical resonator, the second optical coupler to couple light in the optical resonator that circulates along the first direction out of the optical resonator as an output light beam; and a feedback optics device located in an optical path of the output light beam output by the second optical coupler to receive the output light beam and to include a second reflector reflects at least a portion of the output light beam back into the second optical coupler as a reflected light beam, wherein the second optical coupler couples at least a portion of the reflected light beam into the optical resonator along the second direction to increase optical energy of light in the optical resonator that circulates along the second direction to enhance optical energy that is fed back to the SOA by the first optical coupler to effectuate a laser resonator formed by the first and second optical reflectors to produce laser light.

In various implementations of the above and other devices and methods described in this patent document, a laser can be a tunable laser and can be tuned in response to a control signal to produce a laser beam at a laser frequency. The optical resonator can be structured to support whispering gallery modes circulating in the optical resonator and is optically coupled to the laser to receive a portion of the laser beam into the optical resonator in one or more whispering gallery modes and to feed laser light in a whispering gallery mode in the optical resonator back to the laser to stabilize the laser frequency at a frequency of the whispering gallery mode and to reduce a linewidth of the laser. The optical resonator can be configured to be a tunable resonator to change its resonances or the frequencies of the whispering gallery modes. Various technical features in the described laser devices and methods can be implemented in ways that achieve one or more technical advantages or benefits such as enhanced and robust laser locking performance, and compact laser device designs including providing self-injection locked lasers on integrated optical chips.

These and other aspects, their examples and implementations are described in detail in the drawings, the detailed description, and the claims.

BRIEF DESCRIPTION OF THE DRAWINGS

FIG. 2 includes FIGS. 2a, 2b, 2c and 2d showing designs of the reflector for the laser device in FIG. 1.

FIGS. 3A and 3B show measurements of a testing laser device based on the design in FIGS. 1 and 2b.

DETAILED DESCRIPTION

Figure 1:
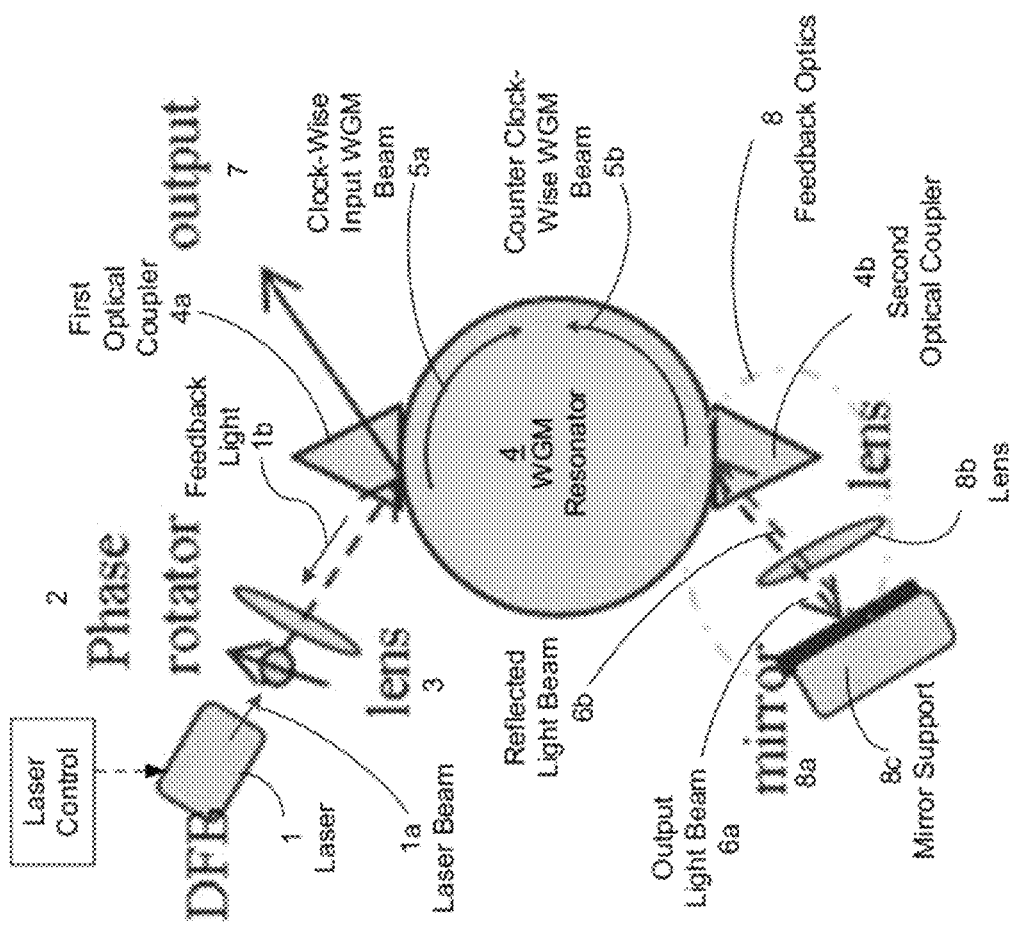
FIG. 1 shows an example of a laser device where a laser is optically coupled to a whispering gallery mode optical resonator and is stabilized to the optical resonator via an optical feedback from the optical resonator based on an optical feedback design.

Examples and implementations of techniques and devices described here can use optical resonators in various configurations for self-injection locking based on a reflection feedback. Specific examples provided in the examples below include optical ring resonators, and sphere and non-sphere whispering gallery mode (WGM) resonators including disk and ring shaped WGM resonators. A whispering gallery mode optical resonator can be configured to provide high resonator Q factors to provide both the optical filtering and injection feedback based on the reflection feedback from feedback optics outside the optical resonator. Optical WGM resonators confine light in a whispering gallery mode that is totally reflected within a closed circular optical path. Under proper coupling conditions, light confined in a WGM resonator can be coupled out of the exterior surface of the closed circular optical path of a WGM resonator via the evanescence field of the WG mode. An optical coupler can be used to couple light into or out of the WGM resonator via this evanescent field. As an example, a semiconductor laser can be directly coupled to a high quality factor Q whispering gallery mode resonator (WGM) via optical coupling in an optical injection design to stabilize the laser. A portion of the light passing through the resonator is reflected back to the laser to lock the laser frequency (wavelength) to the frequency of the high Q mode of the resonator, and to narrow its spectral line. If the WGM resonator is stabilized against environmental perturbations such as temperature variations or vibration, the stability of the modal frequency of the resonator is transferred to the laser frequency or wavelength.

Self-injection locking can significantly increase stability and spectral purity of lasers in various configurations. The locking is based on presence of a master cavity being pumped with the laser. The self-injection is based on resonant Rayleigh scattering (scattering without frequency change) of light inside the optical resonators to produce a counter-propagating light beam in the opposite direction of the laser beam from the laser that is initially coupled into the optical resonators. This counter-propagating light beam inside the optical resonator is injected back to the laser. Depending on the power level of the injected light back to the laser, various operating conditions may establish in the laser where in some cases as the result of the back-scattering, the laser frequency can become locked to the optically pumped mode of the master cavity the Rayleigh scattering originates from. If the optical feedback is sufficiently strong above a certain threshold level, the master cavity can be considered as an external cavity for the laser to achieve both injection locking and modification of the lasing threshold of the laser operation where the master cavity modifies the threshold conditions of the lasing. When the optical feedback from the master cavity is relatively weak below the certain threshold level, the lasing threshold of the laser is not significantly changed by the optical feedback but its stability can improve significantly via the injection locking. If the Rayleigh scattering is too weak, the optical feedback from the injection can be at a low level that is insufficient to establish injection locking of the laser frequency to the mode of the master cavity. The techniques of reflection feedback in this document can be used to provide desired or optimal feedback regimes for injection locking. In applications, the laser devices described in this document can be used in various devices such as opto-electronic oscillators, optical/photonic RF and microwave receivers, optical comb generators and narrow-linewidth lasers.

The injection locking range, the noise, and the stability of injection-locked lasers or the generated RF or microwave signals in opto-electronic oscillators or RF/microwave receivers can depend on the ratio between the feedback intensity and the intensity inside the laser cavity. The Rayleigh scattering in the optical resonator or the scattering from surface imperfection/structures of the WGM resonators can be used to provide the feedback signal needed for injection locking but may be insufficient for certain applications such as WGM resonators of very high quality factors where scattering in the resonator material or surface structures is minimized or significantly reduced to a level that is insufficient to achieve desired injection locking. The self-injection locking based on a reflection feedback described in this document implements feedback optics to produce feedback light via the optical resonator and can be configured to achieve user-controlled optical injection feedback. The disclosed techniques can be implemented to optimize the injection locking of the laser and the laser stability.

FIG. 1 shows an example of a laser device where a laser 1 is optically coupled to a whispering gallery mode (WGM) optical resonator 4 and is stabilized to the optical resonator 4 via an optical feedback light beam 1b from the optical resonator 4 via self-injection locking. The laser 1 produces a laser beam 1a at a laser frequency and can be in various laser configurations. A semiconductor-based laser, such as a distributed feedback (DFB) semiconductor laser, a semiconductor diode laser or a semiconductor-laser-pumped solid state laser, can be used as the laser 1 in FIG. 1. Other lasers can also be implemented as the laser 1. The laser 1 is coupled to a laser control circuit which may a diode laser driver circuit that supplies a current to a laser diode in the laser 1. The laser frequency of the laser 1 may drift or fluctuate due to various factors. The optical resonator 4 is structured to support whispering gallery modes circulating in the optical resonator 4 and is optically coupled to the laser 1 to receive a portion of the laser beam 1a into the optical resonator 4 in one or more whispering gallery modes to circulate in the optical resonator 4.

In FIG. 1, two counter-propagating optical beams 5a and 5b inside the optical resonator 4 in one or more whispering gallery modes are illustrated. A first optical coupler 4a is provided to be located in an optical path of the laser beam 1a to couple at least a portion of the laser beam 1a into the optical resonator 4 as the beam 5a to circulate in the optical resonator 4 along a first direction (e.g., the clock-wise direction as shown in FIG. 1) and to couple a light beam 5b in the optical resonator 4, that circulates along a second direction opposite to the first direction (e.g., the counter-clock-wise direction as shown in FIG. 1), out of the optical resonator as feedback light 1b to the laser 1 to stabilize the laser frequency and to reduce a linewidth of the laser 1. At a location different from the first coupler 4a, a second optical coupler 4b is coupled to the optical resonator 4 and is used to couple light in the clock-wise beam 5a in the optical resonator 4 out of the optical resonator 4 as an output light beam 6a.

Notably, a feedback optics device 8 is located in an optical path of the output light beam 6a output by the second optical coupler 4b to receive the output light beam 6a and to reflect at least a portion of the output light beam 6a back into the second optical coupler 4b as a reflected light beam 6b. The second optical coupler 4b couples at least a portion of the reflected light beam 6b into the optical resonator 4 along the counter-clock-wise direction as shown in FIG. 1 to increase optical energy of the counter clock-wise beam 5b in the optical resonator 4 to enhance optical energy of the feedback light 1b that is fed back to the laser 1 by the first optical coupler 4a to effectuate injection locking of the laser 1 to the optical resonator 4.

The feedback optics device 8 can be implemented in various configurations. In one configuration, for example, the feedback optics device 8 can include a mirror 8a supported by a mirror support 8c (e.g., a substrate) to reflect part of the output light beam 6a into the resonator 4 so that the optical feedback 1b to the laser 1 increases independently with respect to the efficiency of the Rayleigh scattering in the resonator 4. The mirror 8a can be placed using the second optical coupler 4b, separate from the first optical coupler 4a, as an evanescent field coupler for coupling light between the mirror 8a and the resonator 4. In operation, the output light beam 6a coupled out of the resonator 4 has been optically filtered by the resonator 4 once and the reflected light beam 6b that is coupled by the second optical coupler 4b back into the resonator 4 will undergo the optical filtering by the resonator 4 for the second time. Once light is coupled into the resonator 4, the light is confined in a whispering gallery mode and circulates inside the resonator 4 until a portion of the confined light is coupled out. Hence, the reflection by the feedback optics device 8 allows additional optical filtering of the feedback light 1b by the resonator 4 and thus the feedback light 1b has less noise and better spectral purity than the feedback light that would be produced in absence of the feedback optics device 8. The feedback light beam 1b due to the extra optical filtering has enhanced spectral purity and further suppressed noise and thus can be used to improve spectral purity of the feedback and enhance the laser locking and stabilization of the laser-resonator system in FIG. 1.

Initially, before the light of the laser beam 1a is first coupled into the optical resonator 4 as the clock-wise beam 5a, there is no light inside the optical resonator 4. After the beam 5a is introduced into the optical resonator 4, the scattering inside the optical resonator 4 of the received beam 5a caused by the resonator material (e.g., Rayleigh scattering) and/or surface structures on the optical resonator surface where the whispering gallery modes are present can lead to initial generation of the counter clock-wise beam 5b. The feedback optics device 8 is designed to produce the reflected light beam 6b that is the primary source for generating the counter clock-wise beam 5b and the feedback light 1b to the laser 1. For certain WGM resonators that are engineered to produce high Q factors, scattering caused by the resonator material and/or surface structures may be minimized or reduced to a level insufficient to cause injection locking. In such cases, the desired level of the feedback light 1b is produced by the feedback optics device 8.

In many implementations, the feedback light 1b from the resonator 4 to the laser 1 is to provide a spectrally pure frequency reference to which the laser is locked to via injection locking In these implementations, it is desirable that the feedback light 1b is coupled out of a single whispering gallery mode in the resonator 4 without other spectral components and the laser light in the resonator 4 has a sufficiently low optical power that does not cause significant nonlinearity or thermal effects or instability inside the resonator 4 to cause other spectral components other than the spectrally pure frequency dictated by the single whispering gallery mode in the resonator 4. Therefore, the first optical coupler 4a is configured to couple a small portion of the laser beam 1a of the laser 1 into the optical resonator 4 at a low optical power level that reduces optical nonlinearity or thermal instability caused by the laser beam inside the optical resonator 4. As shown in FIG. 1, the first optical coupler 4a couples a small portion of the laser light into the resonator 4 while exporting the remaining light in the laser beam 1a as part of the output light 7. Depending on the specific configuration of the first optical coupler 4a, the first optical coupler 4a may also couple part of the light of the clock-wise beam 5a out of the resonator 4 as part of the output beam 7.

In FIG. 1, other components may be implemented. In the optical path between the laser 1 and the optical resonator 4, a phase adjustment device 2 and a lens 3 can be provided in some device designs. The phase adjustment device 2 can be a phase rotator to control the phase of the feedback light beam 1b to the laser 1 to ensure a desired phase for the injection locking. The lens 3 can be a lens to collimate or focus the feedback light 1b. In the feedback optics device 8, a lens 8b can be placed between the mirror 8a and the second optical coupler 4b. The mirror 8b reflects the beam back into the resonator 4 along the same optical path. The lens 3 or 8b can be a combination lens assembly having two or more lenses. A collimation lens in various designs includes two or more lenses.

In addition, in the laser device shown in FIG. 1 and other laser device designs described here, an optical bandpass filter such as an optical WDM filter, can be inserted between the laser 1 and the resonator 4 to improve the spectral selectivity of the feedback light beam 1b to the laser 1 by selecting only a desired spectral component or wavelength to transmit through while blocking light of other spectral components or wavelengths. The laser 1 is to be locked at the transmitted wavelength. Similarly, such an optical bandpass filter can also be inserted between the resonator 4 and the reflector 8a.

FIGS. 2a, 2b, 2c and 2d show four examples for implementing the feedback optics device 8 in FIG. 1. In FIG. 2a, a collimating lens is pared with the mirror 8a so that the diverging output beam 6a from the second optical coupler 4b is collimated and reflected back by the mirror 8a along the substantially same optical path. In FIG. 2b, a focusing lens is provided and focuses the output beam 6a onto the mirror 8a which is placed on or near the focus point or plane of the lens. The mirror 8a reflects the light back as the reflected beam 6b to the second optical coupler 4b. In FIG. 2c, a gradient-index (GRIN) lens is to be used, the mirror 8a can be attached on the output facet of the GRIN lens a reflective dielectric coating of a high reflectivity can be formed on the end facet of the GRIN lens as the mirror 8a. FIG. 2d further shows a reflector is used as an end mirror to reflect the light beam 6a back as the reflected light beam 6b and a Faraday rotator is placed in the optical path between the second optical coupler 4b and the reflector as part of the feedback optics device 8 in FIG. 1. In some implementations, the Faraday rotator can be set to rotate optical polarization by 45 degrees in a single pass so the reflected light beam 6b is rotated by 90 degrees.

A testing device was constructed based on the design in FIG. 1 and FIG. 2b where prism evanescent couplers were used to implement the two optical couplers 4a and 4b. The light of a semiconductor laser 1 was coupled into the WGM resonator 4 through the prism coupler 4a. The numerical aperture was matched through the proper choice of the coupling lens 3 between the laser 1 and the prism coupler 4a. A second prism coupler 4b was used to couple a proportion of the light out of the resonator 4. Another lens 8b was used to collimate or focus the output beam 6a. The counter propagating light in the WGM resonator 4 was coupled out through the first prism coupler 4a and was fed back into the laser 1 to effectuate the injection locking. The phase of the returning signal was adjusted by the phase rotator 2 placed between the laser 1 and the prism coupler 4a. Essentially the mirror 8a provided the feedback signal and the WGM resonator 4 operated as a narrow bandwidth optical filter for the feedback signal 1b to the laser 1. The signal strength of the feedback signal 1b to the laser 1 was determined by the combination of the reflectivity of the mirror 8a, the modal coupling efficiency at the two coupling prisms 4a and 4b, and the loading of the two prism couplers 4a and 4b compared with the intrinsic loss of the resonator 4. The optical reflectivity for the feedback beam 1b can be chosen at a value between zero and 100% by controlling the reflectivity of the mirror 8a, the loading of the prisms 4a and 4 band the optical design of the device.

FIGS. 3A and 3B show measurements made from the above testing device. FIG. 3A shows the actual device. FIG. 3A shows the injection locking curve as a function of the laser current (I) to the laser 1 and the laser output (L) in a L-I curve. The laser output was measured by using a photodiode (PD) and the measured PD signal is shown to represent the laser output. The laser current I was linearly swept, the frequency of the laser was swept through the modal frequencies of the resonator 4. The dips indicate the happening of injection locking and the width indicates the injection locking range. The line labeled with "Injection Locking without Feedback Mirror" represents the typical L-I curve where the locking was provided mainly by the Rayleigh scattering without the feedback mirror. The line labeled with "Injection Locking with Feedback Mirror" represents the L-I curve when feedback from the mirror was added. Note that the loading of the two prism couplers were kept the same during the measurements. The measurements readily show that the injection locking range was increased substantially by the feedback mirror. Without the feedback from the mirror, the typical locking range for the testing device was around 1 mA or less in terms of the laser current. After adding the feedback from the mirror, the injection locking range was increased to almost 10 mA.

FIG. 3B shows measurements indicating that the laser locking range can be further increased by increasing the loading of the two prism couplers. The laser locking range is limited by the modal hopping between two neighboring modes as shown in FIG. 3B. Optical resonators of low modal densities or a single mode can be used to increase the laser locking range.

Therefore, the laser can be locked by operating the laser to produce a laser beam at a laser frequency; operating a first optical coupler to (1) couple a portion of the laser beam into an optical resonator, that is structured to support whispering gallery modes, to circulate along a first direction inside the optical resonator, and (2) couple light in the optical resonator, that circulates along a second direction opposite to the first direction, out of the optical resonator as feedback light to the laser to stabilize the laser frequency and to reduce a linewidth of the laser; operating a second optical coupler, at a location different from a location of the first optical coupler with respect to the optical resonator, to couple light in the optical resonator that circulates along the first direction out of the optical resonator as an output light beam; and operating a feedback optics device located in an optical path of the output light beam output by the second optical coupler to receive the output light beam and to reflect at least a portion of the output light beam back into the second optical coupler as a reflected light beam, and to couple at least a portion of the reflected light beam into the optical resonator along the second direction to increase optical energy of light in the optical resonator that circulates along the second direction to enhance optical energy that is fed back to the laser by the first optical coupler to effectuate injection locking of the laser to the optical resonator. In one implementation of this method, a semiconductor laser can be used as the laser to apply a current to the semiconductor laser to produce the laser beam and the reflectivity of the feedback optics device, the first and second optical couplers can be configured to increase a range of the current in which the semiconductor laser is locked in frequency to the optical resonator via injection locking beyond a range of the current for maintaining the injection locking in absence of the feedback optics device.

Figure 4:
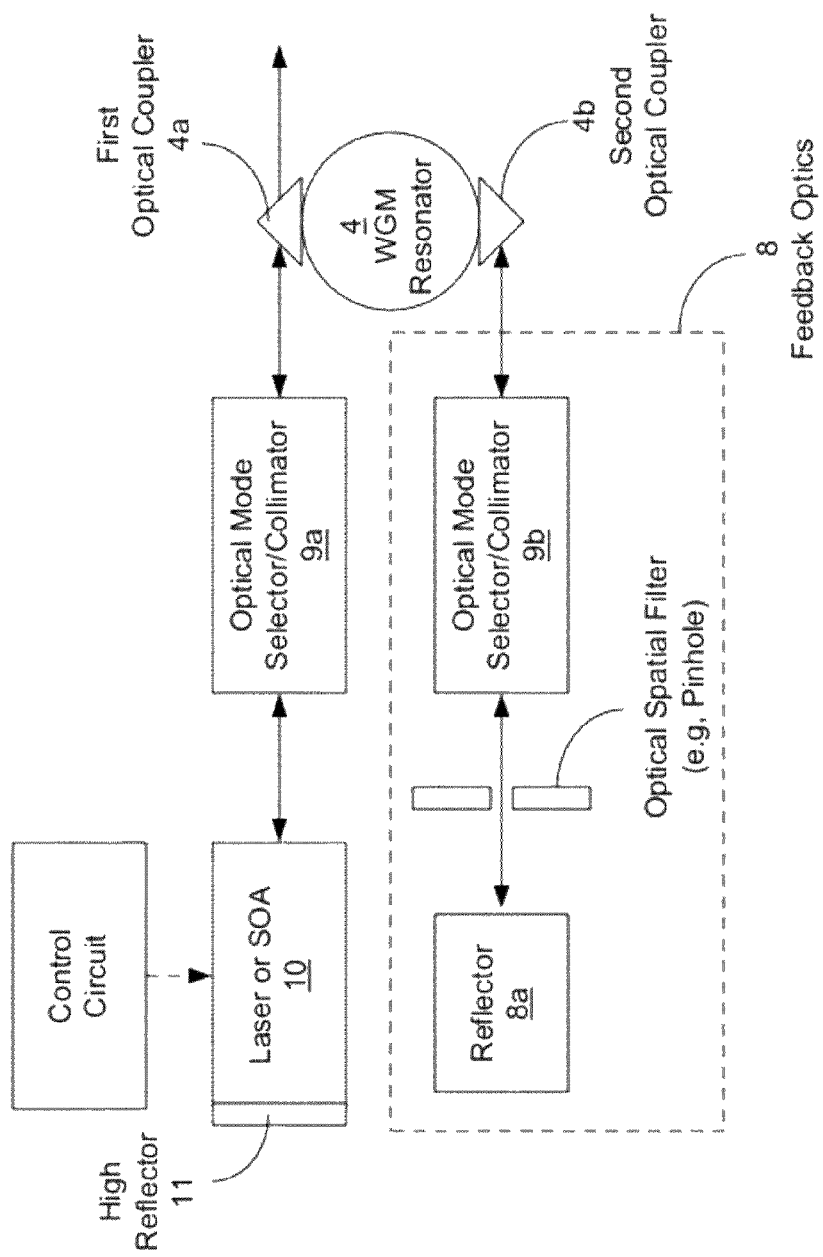
FIG. 4 shows another example of a laser device based on the optical feedback design in FIG. 1.

FIG. 4 shows another exemplary laser device based on the feedback injection locking in FIG. 1. In this example, the laser 1 in FIG. 1 can be a semiconductor optical amplifier (SOA) that is electrically energized by a current from a control circuit to produce a desired optical gain for producing laser light by converting the electrical energy into light. The SOA is configured to have one end facet that is optically reflective to form one high reflector 11 for the laser device and the reflector 8a on the other side of the optical resonator 4 forms the second high reflector of the laser device. In this design, the laser cavity is a Fabry-Perot type resonator formed between the high reflectors where the laser light is bounced back and forth and is amplified. The WGM resonator 4 is inserted inside the Fabry-Perot resonator as an intra-cavity optical filter. Two optical mode selector/collimator devices 9a and 9b are provided on two sides of the WGM resonator 4. The device 9a is inserted between the SOA 10 and the first optical coupler 4a and the device 9b is part of the feedback optics device 8 and is located between the mirror 8a and the second optical coupler 4b. Each device 9a or 9b can include one or more lenses and other optical elements (e.g., phase adjustment device). A spatial aperture may be included to provide desired spatial filtering. For example, an optical spatial filter, e.g., a pinhole, can be inserted between the reflector 8a and the second optical coupler 4b to transmit certain light while rejecting other components located at different locations at the optical spatial filter. The use of the spatial filtering can provide a selective feedback from a desired mode. This feature reduces the noise of the laser. Rayleigh scattering reflects light from all modes to the laser, while the mirror or a mirror with an aperture (e.g. a pin-hole) can separate the modes belonging to different mode families and reflect light for the desired mode. The devices 9a and 9b show that such mode selection can be performed at either or both sides of the WGM resonator 4.

The device 9a or 9b in FIG. 4 can include an optical bandpass filter, such as an optical WDM filter, to improve the spectral selectivity of the feedback light beam to the SOA 10 by selecting only a desired spectral component to transmit through while blocking other spectral components. Either or both of devices 9a and 9b can be configured to include such a filter. This optical filter can be a tunable filter which is tuned, e.g., thermally, mechanically, or via other tuning mechanisms, to lock the SOA to different optical modes.

The WGM resonator 4 can be a tunable to stabilize the whispering gallery mode against environmental perturbations and the feedback of the laser light from the optical resonator to the laser transfers stability of the whispering gallery mode in the optical resonator to the laser. A resonator tuning mechanism can be provided to control and tune the frequency of the whispering gallery mode. Under the injection locking condition, the tuning of the resonator 4 tunes the laser frequency of the laser 1 via the feedback of the laser light from the optical resonator 4 to the laser 1. In one implementation, the resonator tuning mechanism controls and tunes a temperature of the optical resonator 4 to tune the laser frequency of the laser 1 based on a thermal effect. In another implementation, the resonator tuning mechanism applies and controls a pressure exerted on the optical resonator to tune the laser frequency of the laser. In yet another implementation, the optical resonator 4 comprises an electro-optic material that changes a refractive index in response to an electrical potential applied to the optical resonator 4 and the resonator tuning mechanism applies and controls the electrical potential to tune the laser frequency of the laser 1. The resonator tuning mechanism can also be configured to modulate the electrical potential to modulate the frequency of the whispering gallery mode of the optical resonator 4 and the laser frequency of the laser 1. The controls for the laser 1 and the resonator 4 may be used at the same time to increase the frequency tuning range of the laser and thus a control mechanism can be implemented to both adjust the frequency of the whispering gallery mode of the optical resonator 4 and to adjust the laser frequency of the laser 1 while stabilizing the laser frequency at the frequency of the whispering gallery mode.

The WGM resonator 4 in FIGS. 1 and 4 and other devices in this document may be implemented in various configurations. FIGS. 5A, 5B, 6, 7A and 7B illustrate exemplary geometries for implementing such WGM resonators.

Figure 5A:
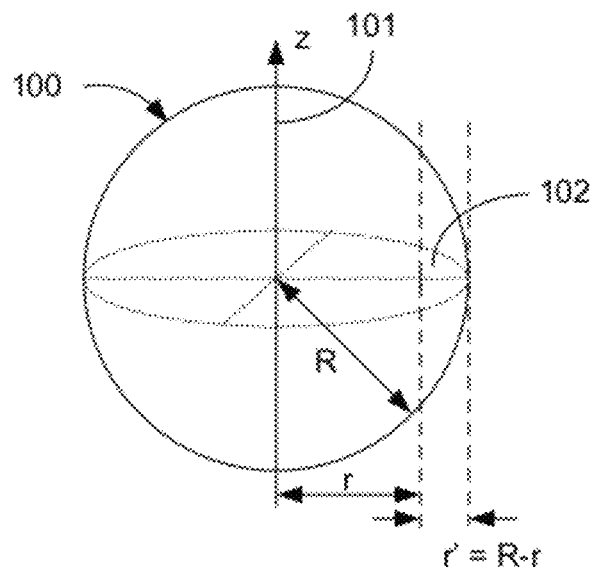
FIGS. 5A, 5B, 6, 7A, and 7B illustrate various exemplary optical resonator configurations that support whispering gallery modes.

FIG. 5A shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

Figure 5B:
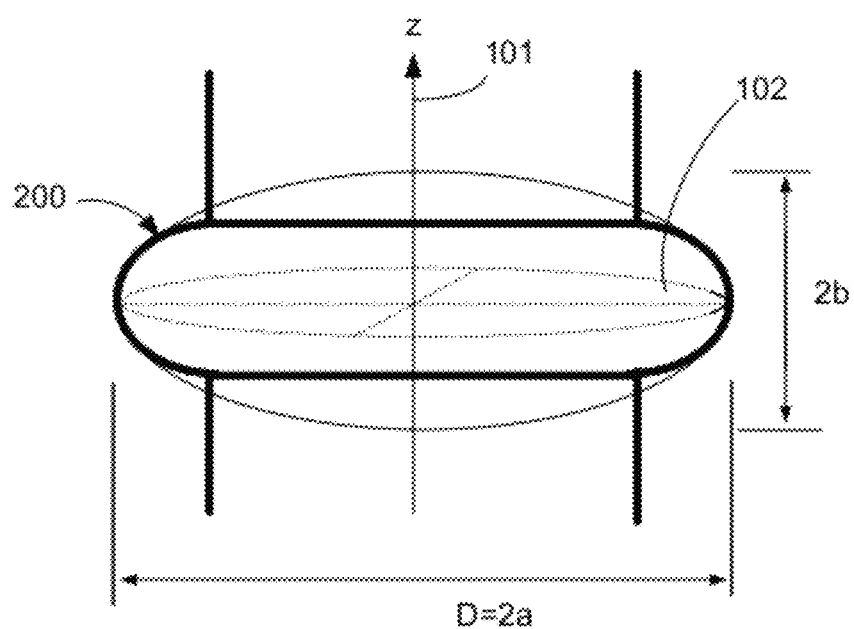

FIG. 5B shows an exemplary spheroidal microresonator 200. This resonator 200 may be formed by revolving an ellipse (with axial lengths a and b) around the symmetric axis along the short elliptical axis 101 (z). Therefore, similar to the spherical resonator in FIG. 5A, the plane 102 in FIG. 4 also has a circular circumference and is a circular cross section. Different from the design in FIG. 3, the plane 102 in FIG. 5B is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 (z) and the WG modes circulate near the circumference of the plane 102 within the resonator 200.

Figure 6:
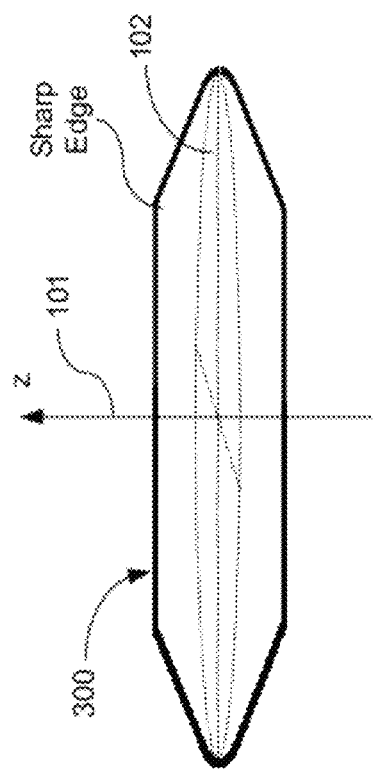

FIG. 6 shows another exemplary WGM resonator 300 which has a non-spherical exterior where the exterior profile is a general conic shape which can be mathematically represented by a quadratic equation of the Cartesian coordinates. Similar to the geometries in FIGS. 5A and 5B, the exterior surface provides curvatures in both the direction in the plane 102 and the direction of z perpendicular to the plane 102 to confine and support the WG modes. Such a non-spherical, non-elliptical surface may be, among others, a parabola or hyperbola. The plane 102 in FIG. 6 is a circular cross section and a WG mode circulates around the circle in the equator.

The above three exemplary geometries in FIGS. 5A, 5B and 6 share a common geometrical feature that they are all axially or cylindrically symmetric around the axis 101 (z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to for the WGM resonator. For example, rings, disks and other geometries formed from a proper section of a sphere may be used as a spherical WGM resonator.

Figure 7A:
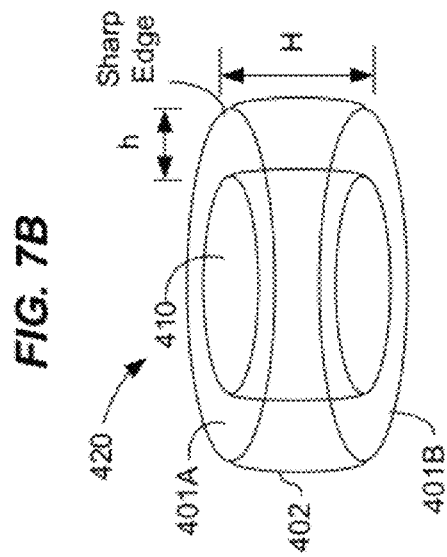
Figure 7B:
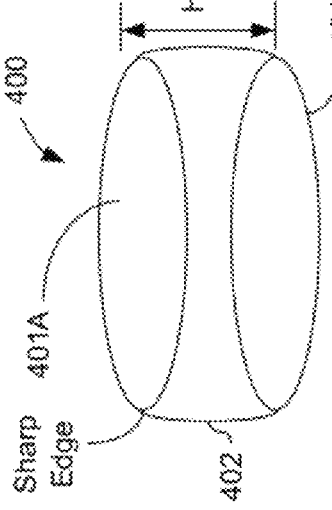

FIGS. 7A and 7B show a disk-shaped WGM resonator 400 and a ring-shaped WGM resonator 420, respectively. In FIG. 7A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated the WGM geometry examples. The exterior curved surface 402 can be selected from any of the shapes shown above to achieve desired WG modes and spectral properties. The ring resonator 420 in FIG. 7B may be formed by removing a center portion 410 from the solid disk 400 in FIG. 7A. Since the WG modes are present near the exterior part of the ring 420 near the exterior surface 402, the thickness h of the ring may be set to be sufficiently large to support the WG modes.

An optical coupler is generally used to couple optical energy into or out of the WGM resonator by evanescent coupling. The optical coupler may be in direct contact with or separated by a gap from the exterior surface of the resonator to effectuate the desired critical coupling. For example, an angle-polished fiber tip can be used as a coupler for the WGM resonator. A waveguide with an angled end facet, such as a planar waveguide or other waveguide, may also be used as the coupler. For another example, the tapered section of a tapered fiber can be used as the coupler. As shown in FIGS. 1 and 4, a micro prism can be used as a coupler for the WGM resonator. Other evanescent couplers may also be used, such as a coupler formed from a photonic bandgap material.

In WGM resonators with uniform indices, a part of the electromagnetic field of the WG modes is located at the exterior surface of the resonators. A gap between the optical coupler and the WGM resonator with a uniform index is generally needed to achieve a proper optical coupling. This gap is used to properly "unload" the WG mode. The Q-factor of a WG mode is determined by properties of the dielectric material of the WGM resonator, the shape of the resonator, the external conditions, and strength of the coupling through the coupler (e.g. prism). The highest Q-factor may be achieved when all the parameters are properly balanced to achieve a critical coupling condition. In WGM resonators with uniform indices, if the coupler such as a prism touches the exterior surface of the resonator, the coupling is strong and this loading can render the Q factor to be small. Hence, the gap between the surface and the coupler is used to reduce the coupling and to increase the Q factor. In general, this gap is very small, e.g., less than one wavelength of the light to be coupled into a WG mode. Precise positioning devices such as piezo elements may be used to control and maintain this gap at a proper value.

The WGM resonator can be made from an electro-optic material and can be tuned by changing the electrical control signal applied to the material. Because the optical injection locking, the laser wavelength or frequency can be tuned with the application of a DC voltage applied to the resonator. In addition, by applying a microwave or RF field to the WGM resonator having a frequency that matches one or more free spectral range of the resonator, the laser frequency can be phase, and/or amplitude modulated. Since the modal frequency of the resonator can be varied by application of temperature, pressure, or in the case of resonators made with electrooptic material, an applied DC potential, the frequency (wavelength) of the laser can also be tuned. Furthermore, the laser remains locked in frequency (wavelength) to the resonator if the frequency of the laser is modulated through the application of a microwave signal to the DC current applied to the laser. Thus a modulatable, narrow linewidth laser can be obtained. When the WGM resonator is made of an electro-optic material, a microwave or RF field can be applied to the resonator with the appropriate coupling circuitry to modulate the intensity of the laser, which continues to remain locked to the WGM resonator.

Figure 8A:
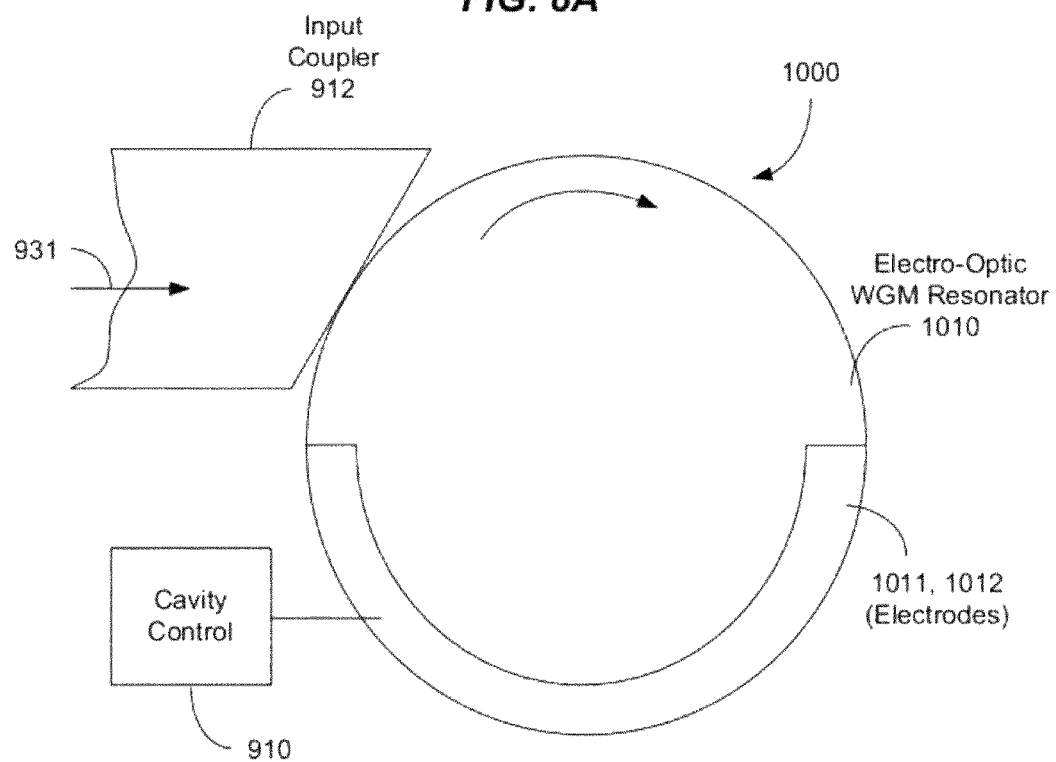
FIGS. 8A and 8B show an example of a tunable electro-optic WGM resonator.
Figure 8B:
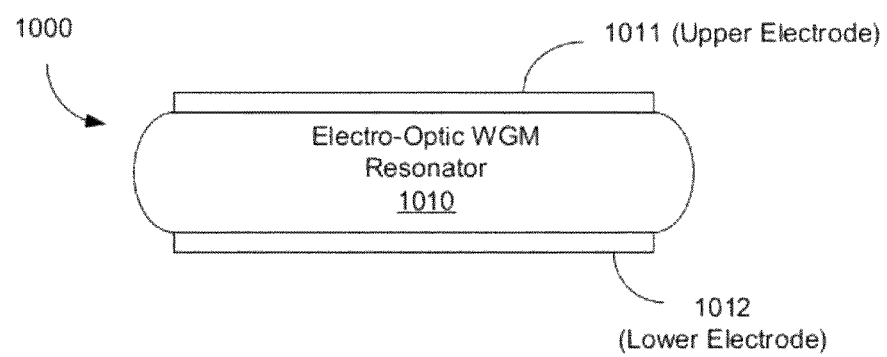

FIGS. 8A and 8B shows an example of a tunable electro-optic WGM resonator 1000 suitable for use in laser devices in this application. The electro-optic material for the resonator 1000 may be any suitable material, including an electro-optic crystal such as Lithium Niobate and semiconductor multiple quantum well structures. One or more electrodes 1011 and 1012 may be formed on the resonator 1000 to apply the control electrical field in the region where the WG modes are present to control the index of the electro-optical material and to change the filter function of the resonator. Assuming the resonator 1000 has disk or ring geometry as in FIG. 6A or 6B, the electrode 1011 may be formed on the top of the resonator and the electrode 1012 may be formed on the bottom of the resonator as illustrated in the side view of the device in FIG. 8B. In one implementation, the electrodes 1011 and 1012 may constitute an RF or microwave resonator to apply the RF or microwave signal to co-propagate along with the desired optical WG mode. The electrodes 1011 and 1012 may be microstrip line electrodes. A varying DC voltage can be applied to tune the WGM frequency and an RF or microwave signal can be applied to modulate the WGM frequency.

In some implementations for the design in FIG. 1, a laser control unit can be provided to control the laser 1 by tuning the laser or modulating the laser, and a resonator control unit is provided to tune or modulate the WG resonator 4. The laser control unit and the resonator control unit can be in communication with each other to simultaneously control the laser 1 and the resonator 4 under the injection locking operation condition. For example, both the laser frequency of the laser 1 and the WGM frequency of the resonator 4 can be tuned in synchronization. This may be achieved by splitting the voltage that is applied to the resonator 4 by the resonator control unit as a signal to the laser control unit. The laser control unit applies this split signal to control the current that drives the laser 1. This operation of simultaneously tuning both the laser 1 and the resonator 4 can increase the frequency tuning range of the laser device.

Based on the above, a tunable laser can be controlled and tuned by a whispering gallery mode optical resonator by coupling a laser output into the optical resonator which is made of an electrical-optic material to support a whispering gallery mode, and laser light out of laser light in the whispering gallery mode. The laser light coupled out of the optical resonator is then optically injected back into the laser to stabilize the laser frequency at a frequency of the whispering gallery mode and to reduce a linewidth of the laser. Either or both of the control signal to the laser and an electrical voltage applied to the electrical-optic material of the optical resonator can be controlled to tune the laser frequency while stabilizing the laser frequency at the frequency of the whispering gallery mode. Under this scheme, various operations can be achieved. For example, the electrical voltage applied to the electrical-optic material of the optical resonator can be modulated to modulate the laser frequency. For another example, the electrical voltage applied to the electrical-optic material of the optical resonator can be modulated to modulate the laser output out of the laser, and, the control signal to the laser is simultaneously tuned to tune the laser frequency.

Figure 9:
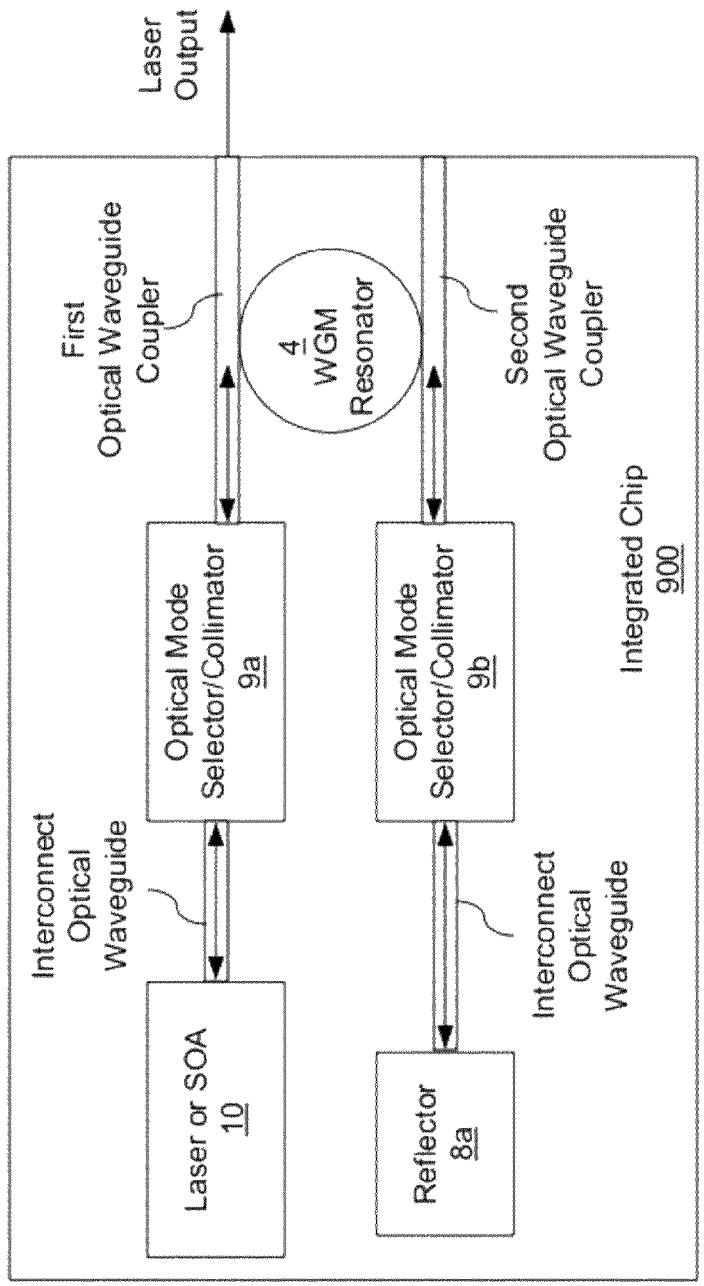
FIG. 9 shows an example of a laser device based on an integrated chip design.

The above device designs can be implemented in integrated chip designs. FIG. 9 shows one example where various components are formed on the chip 900. Examples of integrated components include laser or SOA 10, devices 9a and 9b, and the WGM resonator 4. Between different components, optical waveguides are formed on the chip 900 to guide light. As illustrated, interconnect optical waveguides are formed between the laser/SOA 10, the reflector and the devices 9a and 9b. The first and second optical couplers 4a and 4b in FIGS. 1 and 4 are replaced by two optical waveguide couplers that are coupled to the resonator 4. In some implementations, optical gratings may be formed in the waveguide couplers at the locations interfacing with the resonator 4 to facilitate the coupling.

Figure 10:
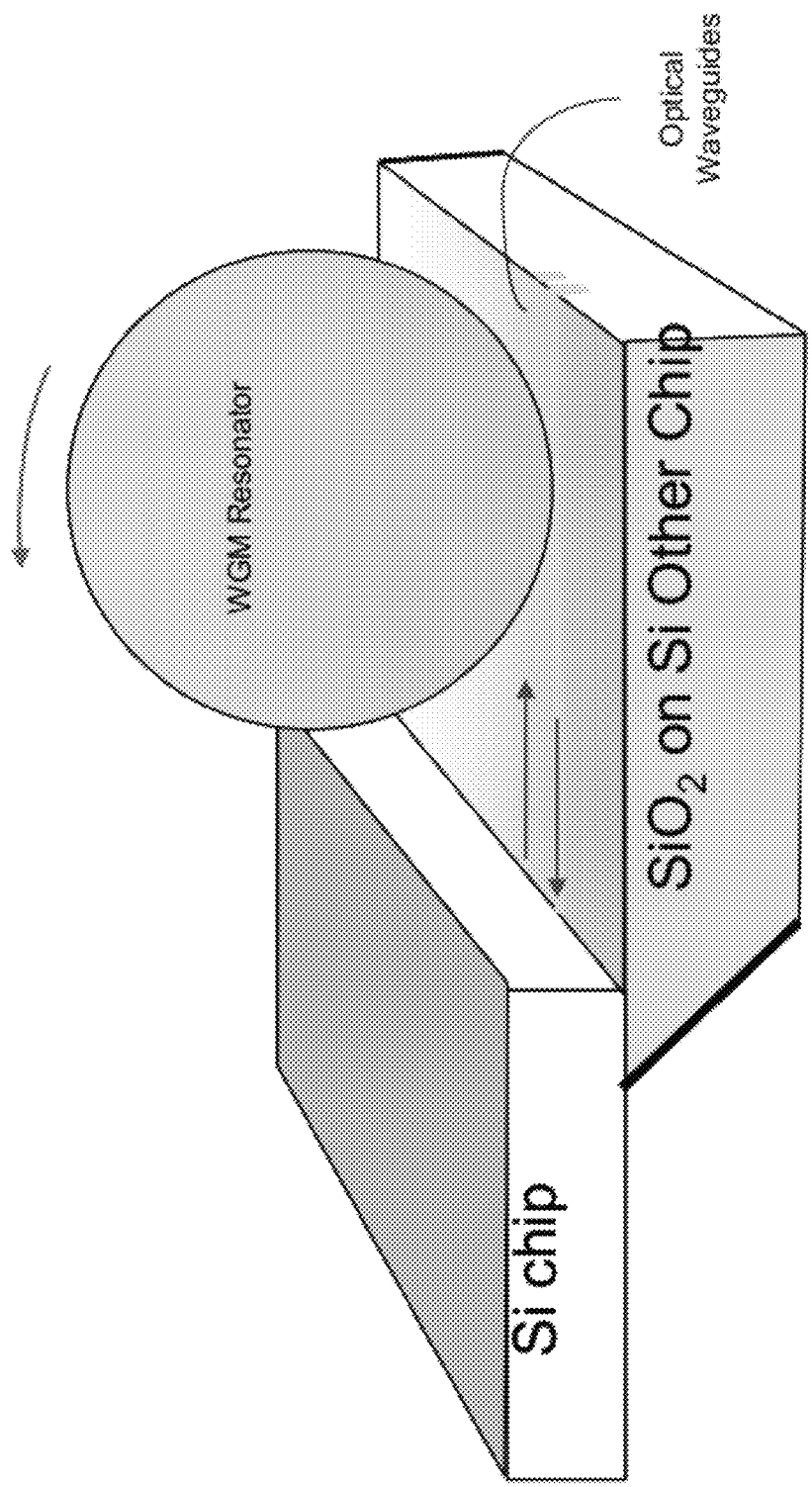
FIGS. 10, 11, 12 and 13 show examples of integrating various components for laser devices.

FIG. 10 shows an example where two chips are integrated. The first chip is a Si chip that includes various electronics. The second chip is another Si chip or a chip formed by other materials for supporting optical waveguides and the WGM resonator. The WGM resonator can be placed on the second chip and is optically coupled to the optical waveguides for getting light into and out of the resonator.

Figure 11:
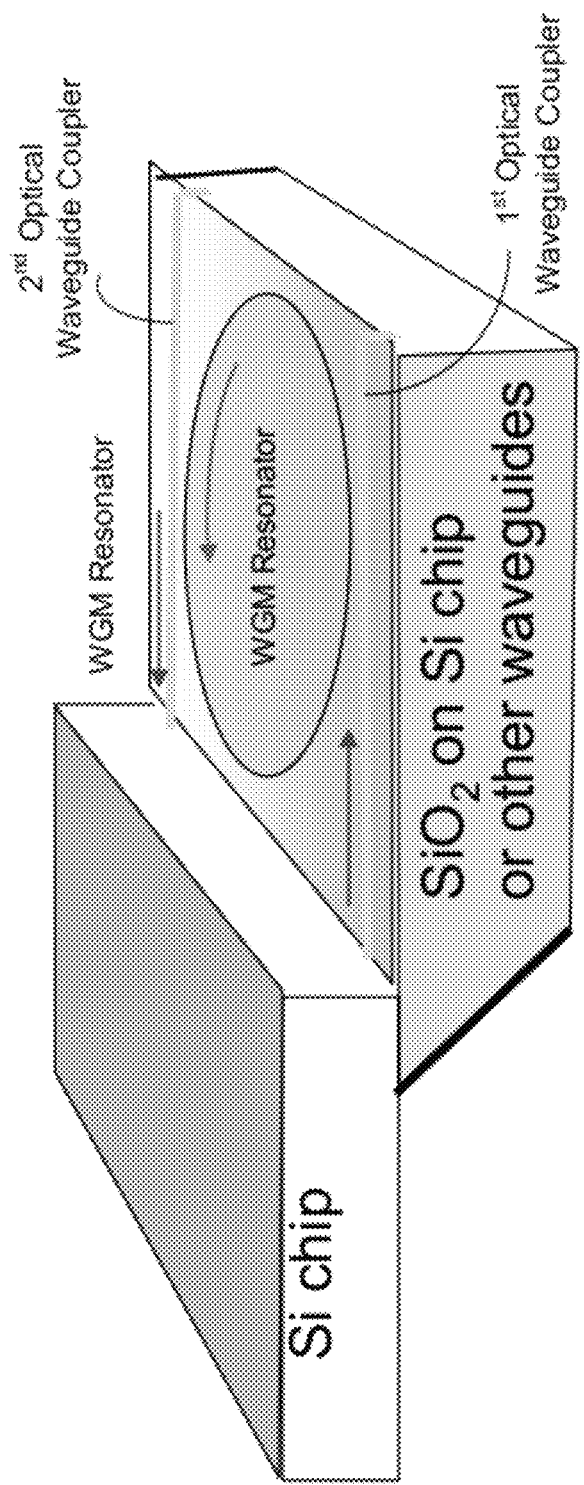

FIG. 11 shows another example where two chips are integrated. In this example, the resonator is a disk resonator that is placed on the second chip or is embedded in a packet formed on the second chip.

Figure 12:
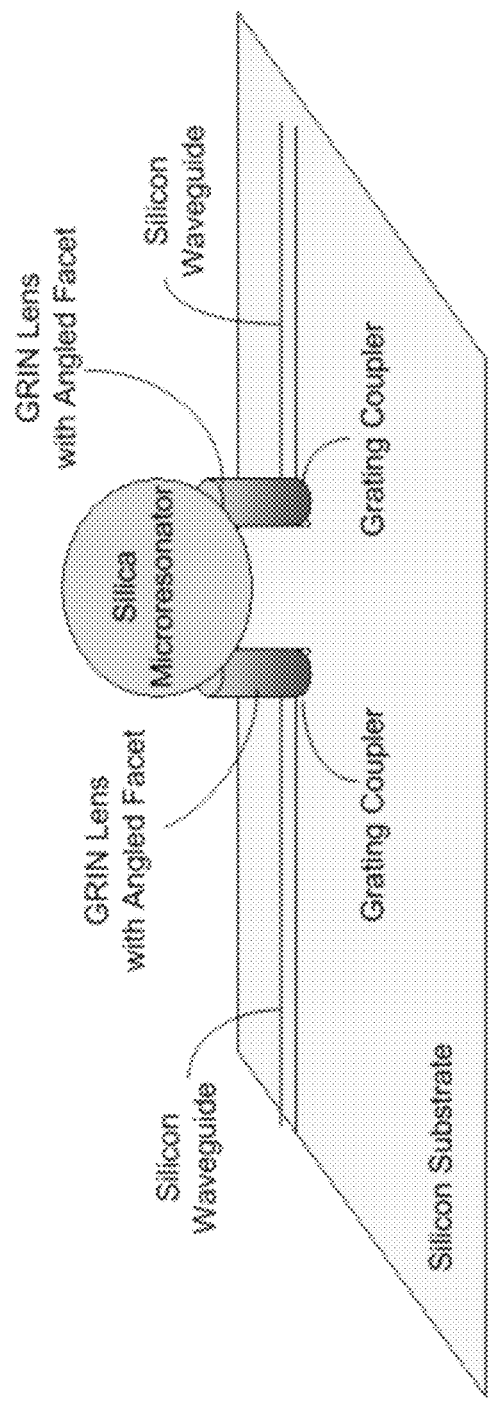

FIG. 12 shows another coupling scheme where the microresonator is positioned and held above the substrate on which the laser device is formed. Two GRIN (gradient index) lenses are used to (1) hold and support the silica microresonator at the designed position above the substrate (e.g., Si) and (2) provide the proper optical coupling with the microresonator. The end facet of each GRIN lens in contact with the microresonator is angled to provide a phase matched coupling condition. The opposite end facet is fixed to the substrate above the corresponding waveguide. A grating coupler is formed at the intersection of the waveguide and the GRIN lens to provide optical coupling between the GRIN lens and the waveguide by redirecting light between the vertical direction and the horizontal direction. Hence, one grating coupler is used as the input coupler to direct input light from one waveguide into the microresonator while the other grating coupler is used as the output coupler to direct light out of the microresonator into the other waveguide. The above design in FIG. 12 may provide good coupling efficiency. The material and the angular facet of each GRIN lens may be selected for optimal coupling to the resonator. As an example, Silica GRIN lenses with a diameter of about 1 mm and 1.8 mm may be used. Alternatively, the GRIN lenses in FIG. 12 may be replaced two by fibers (e.g., single mode fibers) with angled facets. The coupling loss between the fiber end facet and the grating coupler may be about 2 dB or less in some implementations.

Figure 13:
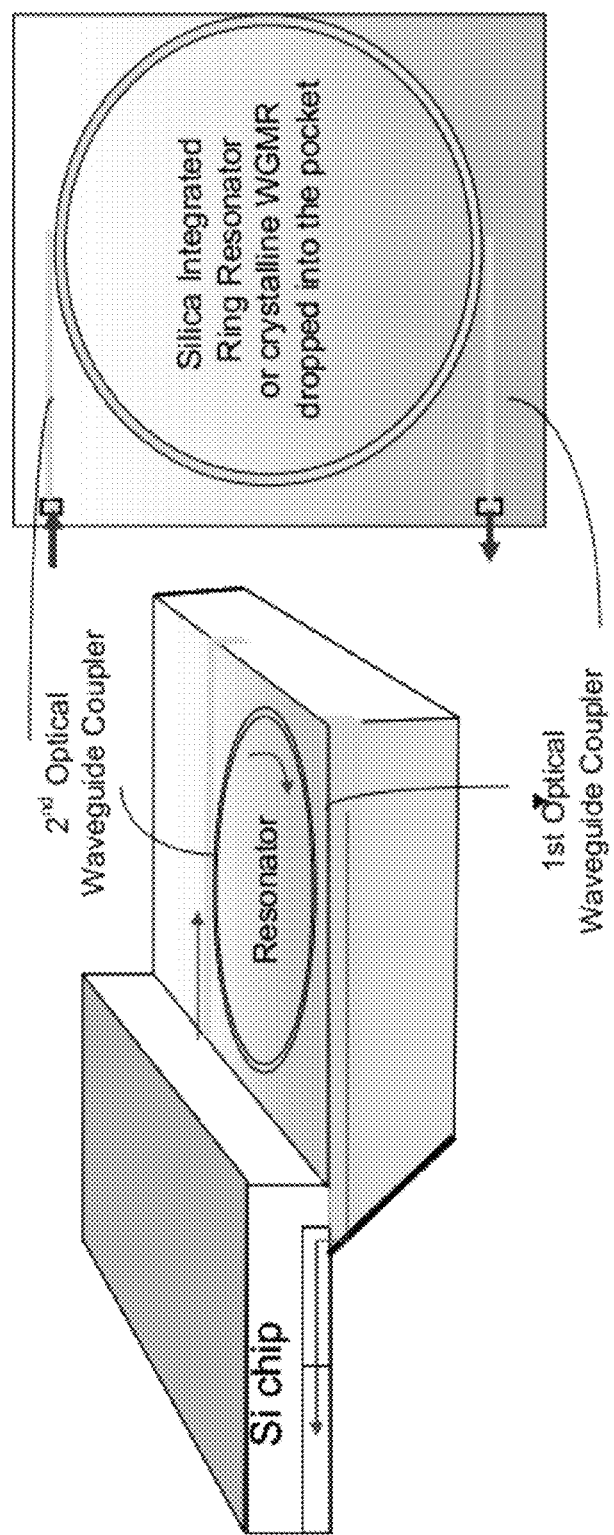

FIG. 13 further shows an integrated design where the optical resonator is a ring resonator formed by a closed ring waveguide on a chip. In various designs described in this document, the WGM resonator can be replaced by such a ring resonator.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations, enhancements and other implementations can be made based on what is described and illustrated in this document.

The invention claimed is:

1. A laser device for locking a laser to an optical whispering gallery mode resonator external to the laser based enhanced injection feedback from the resonator to the laser, comprising:

a laser that produces a laser beam at a laser frequency;

an optical resonator structured to support whispering gallery modes circulating in the optical resonator, the optical resonator being optically coupled to the laser to receive a portion of the laser beam into the optical resonator in one or more whispering gallery modes to circulate in the optical resonator;

a first optical coupler located in an optical path of the laser beam to couple at least a portion of the laser beam into the optical resonator to circulate in the optical resonator along a first direction and to couple light, that circulates in the optical resonator along a second direction opposite to the first direction, out of the optical resonator as feedback light to the laser to stabilize the laser frequency and to reduce a linewidth of the laser;

a second optical coupler coupled to the optical resonator at a location different from a location of the first optical coupler with respect to the optical resonator, the second optical coupler to couple light in the optical resonator that circulates along the first direction out of the optical resonator as an output light beam; and a feedback optics device located in an optical path of the output light beam output by the second optical coupler to receive the output light beam and to reflect at least a portion of the output light beam back into the second optical coupler as a reflected light beam, wherein the second optical coupler couples at least a portion of the reflected light beam into the optical resonator along the second direction to increase optical energy of light in the optical resonator that circulates along the second direction to enhance optical energy that is fed back to the laser by the first optical coupler to effectuate injection locking of the laser to the optical resonator, wherein, the feedback optics device provides a control on the injection locking and the laser frequency of the laser is locked to a resonance frequency of a whispering gallery mode of the optical resonator.

2. The laser device as in claim 1, wherein:
the feedback optics device includes a mirror that reflects light.

3. The laser device as in claim 1, wherein:
the feedback optics device includes a mirror that reflects light and a lens located between the second optical coupler and the mirror.

4. The laser device as in claim 3, wherein:
the mirror is located at or near a focal point of the lens.

5. The laser device as in claim 3, wherein:
the lens is a gradient index lens.

6. The laser device as in claim 5, wherein:
the mirror includes a dielectric coating that is formed on an end facet of the gradient index lens and reflects light.

7. The laser device as in claim 5, wherein:
the mirror is attached to an end facet of the gradient index lens.

8. The laser device as in claim 1, wherein:
the laser is a semiconductor laser that is operated by a current to produce the laser beam.

9. The laser device as in claim 8, wherein:
a reflectivity of the feedback optics device, the first and second optical couplers are configured to increase a range of the current in which the semiconductor laser is locked in frequency to the optical resonator via injection locking beyond a range of the current for maintaining the injection locking in absence of the feedback optics device.

10. The laser device as in claim 1, wherein:
the first and second optical couplers are optical evanescent couplers that evanescently couple light into and out of the optical resonator.

11. The laser device as in claim 1, comprising:
a lens located between the laser and the first optical coupler to provide matching in numerical aperture in coupling the laser beam into the optical resonator.

12. The laser device as in claim 1, comprising:
a phase rotator located between the laser and the first optical coupler to adjust a phase of the feedback light to the laser.

13. The laser device as in claim 1, wherein:
the feedback optics device includes a reflector that reflects light and a Faraday rotator located between the reflector and the second optical coupler.

14. The laser device as in claim 1, wherein:
the optical resonator is a tunable resonator that changes a frequency of the resonator in response to a control signal.

15. The laser device as in claim 14, wherein:
the optical resonator includes an electro-optic material and the control signal is an electrical control signal applied to the electro-optic material.

16. The laser device as in claim 14, wherein:
the optical resonator changes the frequency of the resonator in response to a change in temperature of the optical resonator.

17. The laser device as in claim 14, wherein:
the optical resonator changes the frequency of the resonator in response to a change in a pressure applied to the optical resonator.

18. The laser device as in claim 1, comprising:
an optical bandpass filter located between the laser and the first optical coupler or between the feedback optics device and the second optical coupler and configured to transmit light at a desired wavelength for locking the laser while blocking light at other wavelengths.

19. A laser device for locking a laser to an optical whispering gallery mode resonator external to the laser based enhanced injection feedback from the resonator to the laser, comprising:
a laser that produces a laser beam at a laser frequency;
an optical resonator structured to support whispering gallery modes circulating in the optical resonator, the optical resonator being optically coupled to the laser to receive a portion of the laser beam into the optical resonator in one or more whispering gallery modes to circulate in the optical resonator;
a first optical coupler located in an optical path of the laser beam to couple at least a portion of the laser beam into the optical resonator to circulate in the optical resonator along a first direction and to couple light, that circulates in the optical resonator along a second direction opposite to the first direction, out of the optical resonator as feedback light to the laser to stabilize the laser frequency and to reduce a linewidth of the laser;
a second optical coupler coupled to the optical resonator at a location different from a location of the first optical coupler with respect to the optical resonator, the second optical coupler to couple light in the optical resonator that circulates along the first direction out of the optical resonator as an output light beam; and a feedback optics device located in an optical path of the output light beam output by the second optical coupler to receive the output light beam and to reflect at least a portion of the output light beam back into the second optical coupler as a reflected light beam, wherein the second optical coupler couples at least a portion of the reflected light beam into the optical resonator along the second direction to increase optical energy of light in the optical resonator that circulates along the second direction to enhance optical energy that is fed back to the laser by the first optical coupler to effectuate injection locking of the laser to the optical resonator, wherein:
the first optical coupler couples a small portion of the laser beam into the optical resonator to reduce optical nonlinearity or thermal instability caused by the laser beam inside the optical resonator.

20. A method for locking a laser to an optical whispering gallery mode resonator external to the laser based enhanced injection feedback from the resonator to the laser, comprising:
operating a laser to produce a laser beam at a laser frequency;
operating a first optical coupler to (1) couple a portion of the laser beam into an optical resonator, that is structured to support whispering gallery modes, to circulate along a first direction inside the optical resonator, and (2) couple light in the optical resonator, that circulates along a second direction opposite to the first direction, out of the optical resonator as feedback light to the laser to stabilize the laser frequency and to reduce a linewidth of the laser;
operating a second optical coupler, at a location different from a location of the first optical coupler with respect to the optical resonator, to couple light in the optical resonator that circulates along the first direction out of the optical resonator as an output light beam;
operating a feedback optics device located in an optical path of the output light beam output by the second optical coupler to receive the output light beam and to reflect at least a portion of the output light beam back into the second optical coupler as a reflected light beam, and to couple at least a portion of the reflected light beam into the optical resonator along the second direction to increase optical energy of light in the optical resonator that circulates along the second direction to enhance optical energy that is fed back to the laser by the first optical coupler to effectuate injection locking of the laser to the optical resonator; and
configuring the feedback optics device to have a sufficiently high reflectivity to cause the feedback light to the laser to be at an optical power level above an optical power level of scattered light caused by scattering in the optical resonator.

21. The method as in claim 20, comprising:
coupling a small portion of the laser beam of the laser into the optical resonator to reduce optical nonlinearity or thermal instability caused by the laser beam inside the optical resonator.

22. The method as in claim 20, comprising:
using a semiconductor laser as the laser to apply a current to the semiconductor laser to produce the laser beam;
configuring a reflectivity of the feedback optics device, the first and second optical couplers to increase a range of the current in which the semiconductor laser is locked in frequency to the optical resonator via injection locking beyond a range of the current for maintaining the injection locking in absence of the feedback optics device.

23. A laser device for generating and locking laser light to a resonance of an optical whispering gallery mode resonator, comprising:
- a first optical reflector that reflects light;
- a semiconductor optical amplifier (SOA) located on one side of the first optical reflector and configured to produce an optical gain and amplify light;
- an optical resonator structured to support optical whispering gallery modes circulating in the optical resonator in two opposite directions, the optical resonator being optically coupled to the SOA to receive light from the SOA;
- a first optical coupler located to couple light from the SOA into the optical resonator to circulate in the optical resonator along a first direction and to couple light, that circulates in the optical resonator along a second direction opposite to the first direction, out of the optical resonator as feedback light to the SOA, wherein the SOA is located between the first optical reflector and the first optical coupler;
- a second optical coupler coupled to the optical resonator at a location different from a location of the first optical coupler with respect to the optical resonator, the second optical coupler to couple light in the optical resonator that circulates along the first direction out of the optical resonator as an output light beam; and
- a feedback optics device located in an optical path of the output light beam output by the second optical coupler to receive the output light beam and to include a second reflector reflects at least a portion of the output light beam back into the second optical coupler as a reflected light beam, wherein the second optical coupler couples at least a portion of the reflected light beam into the optical resonator along the second direction to increase optical energy of light in the optical resonator that circulates along the second direction to enhance optical energy that is fed back to the SOA by the first optical coupler to effectuate a laser resonator formed by the first and second optical reflectors to produce laser light, wherein the optical resonator is a tunable resonator that changes a frequency of the resonator in response to a control signal to tune a frequency of the laser light while the feedback optics device operates to effectuates enhanced optical feedback light to the SOA to reduce a lasing threshold of the laser device.

24. The laser device as in claim 23, wherein:
the optical resonator includes a ring resonator.

25. The laser device as in claim 23, wherein:
the optical resonator includes an electro-optic material and the control signal is an electrical control signal applied to the electro-optic material.

26. The laser device as in claim 23, wherein:
the optical resonator changes the frequency of the resonator in response to a change in temperature of the optical resonator.

27. The laser device as in claim 23, wherein:
the optical resonator changes the frequency of the resonator in response to a change in a pressure applied to the optical resonator.

28. The laser device as in claim 23, comprising:
an optical bandpass filter located between the SOA and the first optical coupler or between the feedback optics device and the second optical coupler and configured to transmit light at a desired wavelength while blocking light at other wavelengths.

* * * * *